United States Patent
Gosima

[19]
[11] Patent Number: 5,942,375
[45] Date of Patent: Aug. 24, 1999

[54] METHOD OF FABRICATING PRINTED WIRING BOARD

[75] Inventor: Tutomu Gosima, Toyama, Japan

[73] Assignee: NEC Corporation, Tokyo, Japan

[21] Appl. No.: 08/912,068

[22] Filed: Aug. 15, 1997

[30] Foreign Application Priority Data

Aug. 29, 1996 [JP] Japan .................................. 8-228928

[51] Int. Cl.⁶ ........................................... G03F 7/20
[52] U.S. Cl. ...................... 430/313; 430/395; 430/396
[58] Field of Search ................................. 430/313, 323, 430/396, 311

[56] References Cited

U.S. PATENT DOCUMENTS

| | | | |
|---|---|---|---|
| 3,704,055 | 11/1972 | Hong | 350/128 |
| 5,185,625 | 2/1993 | Abe et al. | 355/26 |
| 5,516,456 | 5/1996 | Shinohara et al. | 252/299.01 |
| 5,669,800 | 9/1997 | Ida et al. | 430/396 |

FOREIGN PATENT DOCUMENTS 4-56189  2/1992  Japan .
456189  2/1992  Japan .

OTHER PUBLICATIONS

JP 4–56189 patent abstract, Arai, Feb. 1992.
JP 409186429 patent abstract, Matsuyama et al, Jul. 1997.

*Primary Examiner*—Kathleen Duda
*Attorney, Agent, or Firm*—Young & Tompson

[57] ABSTRACT

A method of fabricating a printed wiring board, including the steps of (a) applying a photoresist film to a surface of a printed wiring board and inner surfaces of holes formed with the printed wiring board throughout a thickness thereof, (b) exposing the photoresist film to a light through a mask film and further through a light scattering layer composed of glass beads, and (c) developing and etching the photoresist film to form through-holes throughout the printed wiring board. For instance, the light scattering layer is constituted of two transparent light-transmissive films and a glass bead layer sandwiched between the transparent light-transmissive films. The method enables the inner surfaces of the holes to be sufficiently exposed to a light such as ultraviolet ray, to thereby provide a printed wiring board having fine through-holes.

20 Claims, 3 Drawing Sheets

METHOD OF FABRICATING PRINTED WIRING BOARD

BACKGROUND OF THE INVENTION

1. Field of the Invention

The invention relates to a method of fabricating a printed wiring board, and more particularly to a method of a fabricating a printed wiring board which method is capable of forming fine through-holes suitable particularly for a highly densified wire arrangement. The invention relates also to a light scattering layer used in the method.

2. Description of the Related Art

A conventional method of fabricating a printed wiring board includes the steps of forming holes with a printed wiring board, plating the holes, applying a photoresist film by electrodeposition coating to a surface of the printed wiring board and inner surfaces of the holes, attaching a mask film to the printed wiring board, placing the printed wiring board on an exposure table, and then radiating ultraviolet Rays to the printed wiring board to thereby expose the photoresist film in selected regions to the ultraviolet Rays. Then, the photoresist film is developed and etched. Thus, there is completed a printed wiring board including desired through-holes, non-desired through-holes and desired circuits. Hereinafter, the term "desired through-holes" mean through-holes having inner surfaces plated with metal such as copper for electrically connecting upper and lower wiring layers with each other therethrough, and the term "non-desired through-holes" mean through-holes having inner surfaces which do not need to be plated with metal, because they are not expected to electrically connect upper and lower wiring layers with each other therethrough. The photoresist film formed by electrodeposition coating may be negative type where a photoresist film is cured when exposed to a light or positive type where a photoresist film is decomposed when exposed to a light.

When desired through-holes and non-desired through-holes are concurrently formed in a printed wiring board, the following steps are carried out.

When negative type photoresist film is employed, a photoresist film coated on inner surfaces of desired through-holes is exposed to ultraviolet rays so as to act as an etching resist. In contrast, non-desired through-holes which are not needed to be plated with copper are not exposed to ultraviolet rays by a mask film covering the non-desired through-holes therewith, and hence a photoresist film coated on inner surfaces of the non-desired through-holes is removed by development. Then, copper is removed in selected regions by etching to thereby form desired through-holes and non-desired through-holes.

When positive type photoresist film is employed, a photoresist film coated on inner surfaces of non-desired through-holes is exposed to ultraviolet rays. Since the photoresist film is optically decomposed by ultraviolet rays, the photoresist film is removed when developed. A photoresist film coated on inner surfaces of desired through-holes which need to be plated with copper is kept from being exposed to ultraviolet rays by a mask film so as to act as an etching resist. Thereafter, copper is removed in selected regions by etching to thereby form desired through-holes and non-desired through-holes.

These days, a printed wiring board is required to have a higher density in wire arrangement. Hence, it is indispensable for a printed wiring board to include fine circuits, desired through-holes having a smaller diameter, but having a higher aspect ratio defined as a ratio of a thickness of a printed wiring board divided by a diameter of a through-hole, and non-desired through-holes having a higher aspect ratio. To this end, as the aspect ratio is got higher and higher, it is necessary for a photoresist film coated on inner surfaces of desired and non-desired through-holes, in particular, having a smaller diameter, to be sufficiently exposed to ultraviolet rays, whichever type of a photoresist film between negative or positive type is to be employed. However, conventional methods of fabricating a printed wiring board have a difficulty in accomplishing the above mentioned matter.

In order to solve such a problem as mentioned above in a method of fabricating a printed wiring board where a photoresist film is deposited by electrodeposition coating, ultraviolet ray scattering has been suggested as a solution to the problem. For instance, Japanese Unexamined Patent Publication No. 4-56189 has suggested a method of scattering parallel beams in order that a photoresist film coated on inner surfaces of holes is exposed to ultraviolet rays to much degree. In the suggested method, there is used a transparent sheet having fine irregularities on a surface thereof.

FIG. 1 is a partial cross-sectional view of a printed wiring board, illustrating the suggested method. A photoresist film 3 is applied by electrodeposition coating onto upper and lower surfaces of a printed wiring board 1 and inner surfaces of desired through-holes 2a and non-desired through-holes 2b formed in the printed wiring board 1 throughout a thickness thereof. The photoresist film 3 is of negative type.

The printed wiring board 1 is covered on upper and lower surfaces thereof with mask films 4 including light-transmissive portions and light-intransmissive portions. In FIG. 1, the light-intransmissive portions are designated as hatched portions, and the light-transmissive portions are designated as non-hatched portions. As illustrated, the light-transmissive portion is in alignment with the desired through-hole 2a, and the light-intransmissive portion is in alignment with the non-desired through-hole 2b.

Light scattering layers 10 comprising a transparent layer having fine irregularities are applied onto the mask films 4 above the upper and lower surfaces of the printed wiring board 1. Transparent frames 5 are applied onto the light scattering layers 10.

Ultraviolet ray sources 6 disposed at opposite sides of the printed wiring board 1 radiate ultraviolet rays 7 onto the printed wiring board 1. The thus radiated ultraviolet rays 7 are refracted in the light scattering layer 10 to thereby establish scattered rays 9a. Since a portion of the photoresist film 3 coated on inner surfaces of the desired through-hole 2a is located below the light-transmissive portion, or non-hatched portion, of the mask film 4, the portion is exposed to the scattered light 9a. Thus, the portion is cured and hence acts as an etching resist. Since a portion of the photoresist film 3 coated on inner surfaces of the non-desired through-hole 2b is located below the light-intransmissive portion, or hatched portion, of the mask film 4, the portion is not exposed to the scattered rays 9a. Thus, the portion is removed in development of the photoresist film. Thereafter, the printed wiring board 1 is etched with the cured photoresist film acting as an etching mask, to thereby form desired and non-desired through-holes.

As mentioned above, the ultraviolet rays 7 transmitted from the ultraviolet ray sources 6 are changed into the scattered lights 9a by the light scattering layers 10. Hence, the portion of the photoresist film 3 coated on inner surfaces of the desired through-holes 2a is exposed to the ultraviolet ray to much more degree, which is effective to desired and non-desired through-holes having a higher aspect ratio, required for highly densified wire arrangement.

However, in accordance with the analysis conducted by the inventor, it has been found that all the parallel ultraviolet rays 7 are not always converted into the scattered rays 9a, and that a part of the parallel ultraviolet rays 7 passes through the mask film 4 without being converted into the scattered light 9a. Thus, the method suggested in Japanese Unexamined Patent Publication No. 4-56189 has an upper limitation for exposing a photoresist film coated on inner surfaces of small holes to ultraviolet rays.

SUMMARY OF THE INVENTION

It is an object of the present invention to provide a method of fabricating a printed wiring board by which a photoresist film coated on inner surfaces of fine through-holes is sufficiently, effectively exposed to a light such as an ultraviolet ray.

In one aspect, there is provided a method of fabricating a printed wiring board, including the steps of (a) applying a photoresist film to a surface of a printed wiring board and inner surfaces of holes formed with the printed wiring board throughout a thickness thereof, (b) exposing the photoresist film to a light through a mask film and further through a light scattering layer composed of glass beads, and (c) developing and etching the photoresist film to form through-holes throughout the printed wiring board.

The photoresist film may be applied onto upper and lower surfaces of the printed wiring board as well as inner surfaces of the holes, and may be exposed to a light transmitted from light sources located at opposite sides of the printed wiring board.

It is preferable that the light scattering layer has a multi-layered structure comprising at least one light-transmissive film and a glass bead layer. For instance, the light-transmissive film is preferably embossed, or preferably have fine irregularities on surfaces thereof.

It is preferable that the light scattering layer is comprised of two light-transmissive films and a glass bead layer sandwiched between the light-transmissive films. Glass beads contained in the glass bead layer may have any diameters, unless the diameters are sufficiently small. According to the experiments conducted by the inventor, it is preferable that the glass bead layer includes glass beads having a diameter in the range of 20 $\mu$m to 40 $\mu$m both inclusive. According to the experiments, it has been also found that if the glass bead layer further includes glass beads having a larger diameter, it would be possible to have a more uniform light scattering layer. For instance, it is preferable that the glass bead layer further includes glass beads having a diameter in the range of 200 $\mu$m to 350 $\mu$m both inclusive at 20 weight percent to 50 weight percent, preferably at 30 weight percent.

There is further provided a method of exposing a photoresist film coated on an inner surface of a through-hole to a light, comprising the step of making a light pass through a light scattering layer composed of glass beads.

It is preferable to design the light scattering layer to have the same structure as mentioned earlier in connection with the inventive method.

In another aspect, there is provided a light scattering layer through which a photoresist film applied onto a surface of a printed wiring board and inner surfaces of holes formed with the printed wiring board throughout a thickness thereof is exposed to a light, the light scattering layer including glass beads.

It is preferable to design the light scattering layer to have the same structure as mentioned earlier in connection with the inventive method.

In accordance with the above mentioned invention, a light scattering layer composed of glass beads is disposed at either side or opposite sides of a printed wiring board to which a photoresist film has been applied by electrodeposition coating. It is assumed that first and second ultraviolet ray sources are disposed at opposite sides of the printed wiring board.

When parallel ultraviolet rays transmitted from the first ultraviolet ray source passes through the light scattering layer, a part of the ultraviolet rays is spherically reflected at outer and inner surfaces of the light scattering layer to thereby produce scattering ultraviolet rays. The thus produced scattering ultraviolet rays are radiated onto a photoresist film coated on an inner surface of a through-hole, ensuring increased exposure efficiency.

A part of the ultraviolet rays passes through the light scattering layer without being converted into a scattering ray. This part of the ultraviolet rays is spherically reflected at inner and outer surfaces of an oppositely disposed light scattering layer to thereby produce scattering ultraviolet lays directing towards the first ultraviolet ray source. The thus produced ultraviolet scattering rays are radiated onto a photoresist film coated on an inner surface of a through-hole.

Thus, the firstly and secondly produced ultraviolet scattering rays are both radiated onto a photoresist film coated on an inner surface of a through-hole, which ensures an significant increase in exposure efficiency.

The same as mentioned above is applied to ultraviolet rays transmitted from the second ultraviolet ray source.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Figure 1:
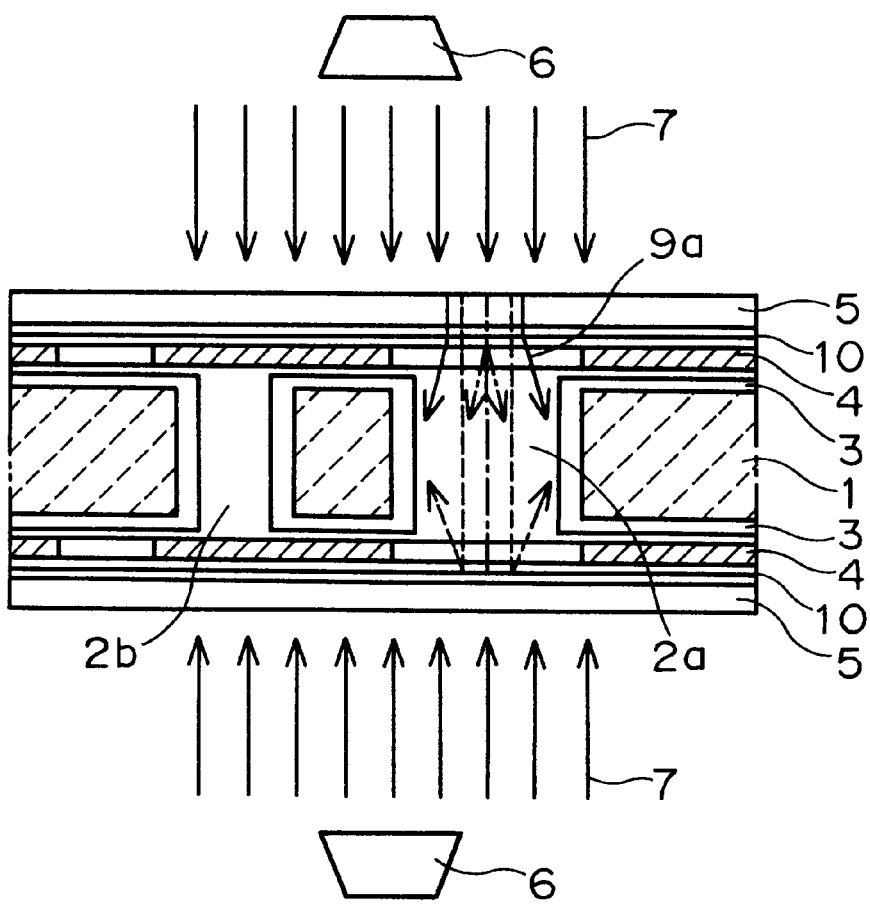
FIG. 1 is a cross-sectional view of a printed wiring board, illustrating a conventional method of fabricating a printed wiring board.
Figure 2:
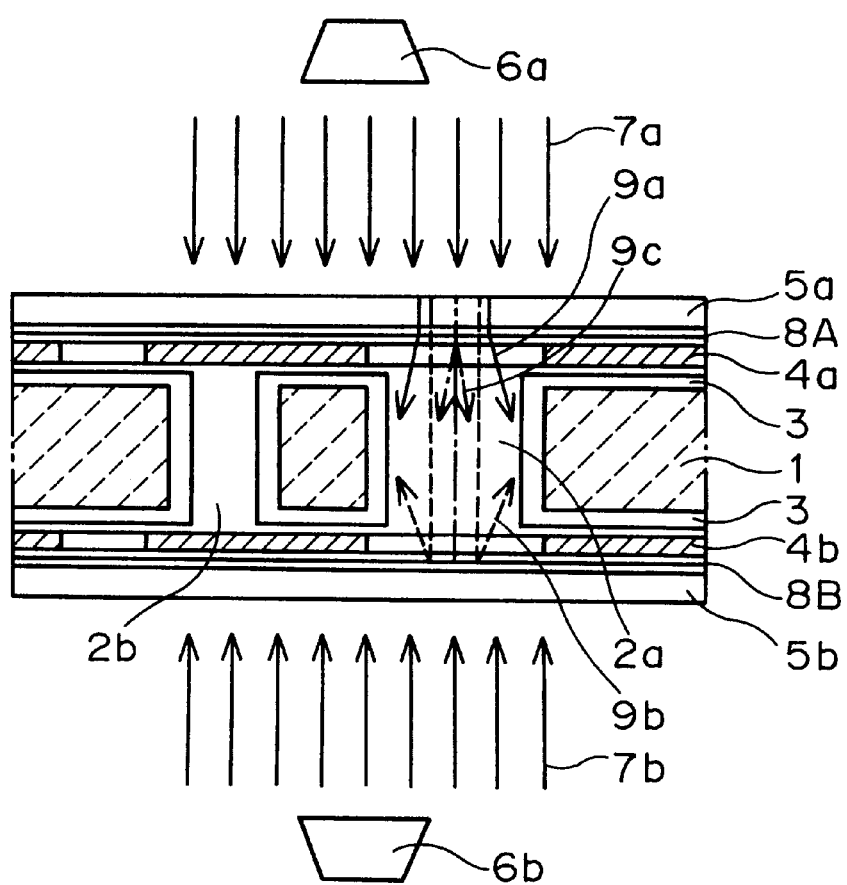
FIG. 2 is a cross-sectional view of a printed wiring board, illustrating a method of fabricating a printed wiring board in accordance with the first embodiment of the invention.

Hereinbelow is explained the first embodiment with reference to FIG. 2. After a printed wiring board 1 has been formed with holes and plated with copper, a photoresist film 3 is applied by electrodeposition coating onto upper and lower surfaces of the printed wiring board and inner surfaces of desired through-holes 2b and non-desired through-holes 2a formed in the printed wiring board 1 throughout a thickness thereof. In the instant embodiment, there is used a positive type electrodeposition resist commercially available from Nihon Paint Co. Ltd., under the tradename of "P-1000" as the photoresist film 3. The photoresist film 3 is formed to have a thickness in the range of about 7 $\mu$m to about 9 $\mu$m.

Then, the printed wiring board 1 is covered on upper and lower surfaces thereof with mask films 4a and 4b. The mask films 4a and 4b have light-transmissive portions indicated as non-hatched regions and light-intransmissive portions indicated as hatched regions. As illustrated in FIG. 2, the light-transmissive portion is in alignment with the non-desired through-hole 2a, and the light-intransmissive portion is in alignment with the desired through-hole 2b.

There are formed light scattering layers 8A and 8B on the mask films 4a and 4b, respectively. The above mentioned printed wiring board 1, the photoresist film 3, the mask films 4a and 4b, and the light scattering layers 8A and 8B are sandwiched between vacuum-baked frames 5a and 5b made of transparent acrylate resin.

Ultraviolet ray sources 6a and 6b are disposed spaced away from the printed wiring board 1 at opposite sides thereof. The ultraviolet ray sources 6a and 6b transmit parallel ultraviolet rays 7a and 7b to the printed wiring board 1.

Figure 3:
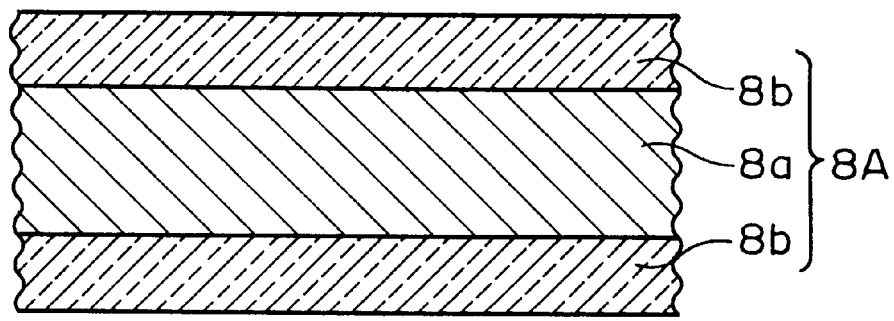
FIG. 3 is a cross-sectional view of the light scattering layer illustrated in FIG. 2.

FIG. 3 illustrates a cross-section of the light scattering layer 8A. The light scattering layer 8A is comprised of two transparent light-transmissive sheets 8b, and a glass bead layer 8a sandwiched between the light-transmissive sheets 8b. The glass bead layer 8a has a thickness of about 1 mm, and uniformly includes a mass of glass beads. In the instant embodiment, there are used glass beads commercially available from Toshiba under the tradename of "GB706K" which have a diameter in the range of 20 μm to 40 μm both inclusive.

Though the instant embodiment employs glass beads having almost uniform diameters, glass beads having a larger diameter may be mixed with the glass beads of the glass bead layer 8a. For instance, the glass beads commercially available from Toshiba under the tradename of "GB201M" which have a diameter in the range of 200 μm to 350 μm both inclusive may be mixed. According to the experiments conducted by the inventor, a preferable weight percent at which the glass beads having a larger diameter such as "GB201M" are mixed with the glass beads having a smaller diameter such as "GB706K" is in the range of 20 wt % to 50 wt %. The most preferable weight percent is about 30 wt %. By mixing glass beads having a larger diameter, there can be obtained a light scattering layer more uniform in glass bead density.

The light scattering layer 8B has the same structure as that of the light scattering layer 8A.

In operation, a portion of the photoresist film 3 located just below the light-transmissive regions of the mask film 4a is exposed to the parallel ultraviolet rays 7a transmitted from the ultraviolet ray source 6a. That is, the photoresist film 3 coated on inner surfaces of the non-desired through-hole 2a is exposed to the ultraviolet rays 7a passing through the light scattering layers 8A and the light-transmissive region of the mask films 4a. Specifically, the parallel ultraviolet rays 7a passing through the light scattering layer 8A are spherically reflected at outer and inner surfaces of the glass bead layer 8a to thereby be changed into scattered rays 9a. Since a portion of the photoresist film 3 coated on inner surfaces of the non-desired through-hole 2a is located below the light-transmissive portion of the mask film 4a, the portion is exposed to the scattered rays 9a. Thus, the portion of the photoresist film 3 is optically decomposed and will be removed in development of the photoresist film 3.

A portion of the ultraviolet rays 7a passing through the light scattering layer 8A without being scattered by the light scattering layer 8A is spherically reflected at inner and outer surfaces of the glass bead layer 8a of the light scattering layer 8B to thereby form reflected rays 9b. The thus reflected ultraviolet rays 9b are also directed to the photoresist film 3 coated on inner surfaces of the non-desired through-hole 2a.

A portion of the scattered rays 9a is also spherically reflected at inner and outer surfaces of the glass bead layer 8a of the light scattering layer 8B to thereby form reflected rays 9b. The thus formed reflected rays 9b are also directed to the photoresist film 3 coated on inner surfaces of the non-desired through-hole 2a.

In addition, a portion of the reflected rays 9a is further reflected at inner and outer surfaces of the glass bead layer 8a of the light scattering layer 8A to thereby form twice reflected rays 9c. The thus formed twice reflected rays 9c are also directed to the photoresist film 3 coated on inner surfaces of the non-desired through-hole 2a.

The scattering of ultraviolet rays as mentioned above in connection with the ultraviolet rays 7a transmitted from the ultraviolet ray source 6a takes place with respect to the ultraviolet rays 7b transmitted from the ultraviolet ray source 6b.

Thus, the portion of the photoresist film 3 coated on an inner surface of the non-desired through-hole 2a is sufficiently exposed to the ultraviolet rays 7a and 7b.

Since a portion of the photoresist film 3 coated on an inner surface of the desired through-hole 2b is located below the light-intransmissive portion of the mask films 4a and 4b, the portion is not exposed to the ultraviolet rays 7a and 7b transmitted from the ultraviolet sources 6a and 6b. Thus, the portion is not optically decomposed and hence acts as an etching resist.

Thereafter, the printed wiring board 1 is etched with the cured photoresist film acting as an etching mask, to thereby form desired and non-desired through-holes.

The inventor conducted the experiments in order to verify the advantages of the invention over the conventional methods. As the printed wiring board 1 was employed a glass epoxy multi-layered board having a thickness of 1.6 mm. As the photoresist film 3 was employed the earlier mentioned positive type electrodeposition resist commercially available from Nihon Paint Co. Ltd., under the tradename of "P-1000". In the experiments, when ultraviolet rays were radiated perpendicularly onto the printed wiring board, how much exposure values in horizontal and vertical planes were obtained was measured. There were also observed whether a non-desired through-hole was formed. The samples used in the experiments were a printed wiring board to which the light scattering layer 8A in accordance with the present invention was applied (sample 1), a printed wiring board to which the conventional light scattering layer 10 was applied (sample 2), and a printed wiring board to which no light scattering layer is applied (sample 3). The results are shown in Table 1.

TABLE 1

| thick-ness | Sample 1 1.6 mm | | | Sample 2 1.6 mm | | | Sample 3 1.6 mm | | |
|---|---|---|---|---|---|---|---|---|---|
| A[mJ/cm$^2$] | 150 | 300 | 450 | 150 | 300 | 450 | 150 | 300 | 450 |
| B[mJ/cm$^2$] | 60 | 120 | 180 | 40 | 80 | 120 | 0 | 0 | 0 |
| φ 0.6 | x | ○ | ○ | x | x | ○ | x | x | x |
| φ 0.8 | x | ○ | ○ | x | ○ | ○ | x | x | x |
| φ 1.2 | ○ | ○ | ○ | x | ○ | ○ | x | x | x |

In Table 1, "A" indicates the exposure value in a horizontal plane, and "B" indicates the exposure value in a vertical plane. A through-hole having a diameter of X mm is indicated with φ X. For instance, "φ0.8" indicates a through-hole having a diameter of 0.8 mm.

In general, when a positive type photoresist film is exposed to ultraviolet rays, exposure value is reduced by 200 to 400 mJ/cm$^2$ on an upper surface of the photoresist film. Hence, it is necessary to increase ultraviolet rays in exposure value. When the exposure value is 300 mJ/cm$^2$, the conventional method has an upper limitation at φ0.8. Namely, a through-hole having a smaller diameter than 0.8 mm cannot be formed in accordance with the conventional method (in this case, an aspect ratio is equal to 2. 1.6/0.8=2). Hence, if a through-hole having a diameter of 0.6 mm were formed in accordance with the conventional method, the exposure value has to be increased up to 450 mJ/cm$^2$.

In contrast, the method in accordance with the present invention makes it possible to sufficiently and uniformly expose a photoresist film coated on an inner surface of a through-hole to ultraviolet rays, even when the exposure value is 300 mJ/cm$^2$ and even if the through-hole has a high aspect ratio, such as a through-hole having a diameter of 0.6 mm (the aspect ratio=1.6/0/6≈2.7).

The light scattering layers 8A and 8B produce much oblique ingredients in scattered rays to thereby ensure increased exposure volume in the non-desired through-hole 2a. As is obvious in view of comparison in the exposure value in a vertical plane between samples 1 and 2, sample 1 (the method in accordance with the present invention) provides exposure value much more than sample 2 (the conventional method) by 50%. This shows that the method in accordance with the present invention provides higher exposure efficiency than that of the conventional method. As is obvious in observation of sample 3, a photoresist film coated on an inner surface of a through-hole is scarcely exposed to ultraviolet rays, when a light scattering layer is not provided to a printed wiring board. Hence, it was impossible in sample 3 to concurrently form desired and non-desired through-holes.

Figure 4:
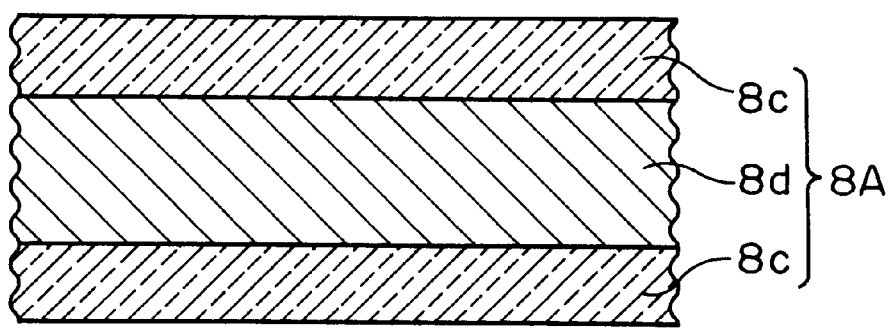
FIG. 4 is a cross-sectional view of another light scattering layer.

FIG. 4 illustrates another structure of the light scattering layers 8A and 8B. The illustrated light scattering layer 8A is comprised of two transparent light-transmissive sheets 8a, and a glass bead layer 8d sandwiched between the light-transmissive sheets 8c. The glass bead layer 8d has the same structure as that of the glass bead layer 8a illustrated in FIG. 3. The transparent light-transmissive sheet 8c is an embossed sheet, and has fine irregularities on a surface thereof. The fine irregularities formed by embossing on a surface of the light-transmissive sheet 8c is advantageous for enhancing light scattering efficiency. For instance, as the transparent light-transmissive sheet 8a, there may be used a transparent sheet commercially available from Somaru Co. Ltd., under the tradename of "Emboss Y".

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-228928 filed on Aug. 29, 1997 including specification, claims, drawings and summary is incorporated herein by reference in its entirety.

What is claimed is:

1. A method of fabricating a printed wiring board, comprising the steps of:

a) providing a printed wiring board with through-holes therein, each through-hole comprising an inner surface, a diameter, and a thickness, the through-hole thickness being equal to a thickness of the printed wiring board;

b) applying a photoresist film as an etching mask to a first planar surface of the printed wiring board and to the inner surfaces of the through-holes;

c) preparing the photoresist film for exposure by providing two light scattering plates, each of the light scattering plates comprising two parallel light-transmissive plates and a glass bead layer intermediate the two light transmissive plates, and placing the printed wiring board intermediate the two light scattering plates;

d) exposing the photoresist film to ultraviolet rays by subjecting the photoresist film on the first planar surface and through-holes to ultraviolet rays from a ultraviolet ray source located proximate to the first planar surface and projecting ultraviolet rays thereon, a portion of the projected ultraviolet rays being scattered by the glass bead layer of the first light scattering plate and thereby forming first scattering rays to expose the inner surfaces of the through-holes, and another portion of the projected ultraviolet rays passing through the first light scattering plate without being scattered thereby, the another portion being scattered and reflected by the glass bead layer of the second light scattering plate to form second scattering rays to additionally expose the inner surfaces of the through-holes; and e) developing the photoresist film and etching the printed wiring board and through-holes.

2. The method of claim 1, further comprising the steps of applying the photoresist film to a second planar surface of the printed wiring board; and placing the printed wiring board intermediate two ultraviolet ray sources and exposing the photoresist film to ultraviolet rays from each of the ultraviolet ray sources so that both the first and second planar surfaces are directly exposed to the ultraviolet rays.

3. The method of claim 1, wherein the at least one of the light-transmissive plates is embossed.

4. The method of claim 1, wherein the at least one of the light-transmissive plates has fine irregularities on a surface thereof.

5. The method of claim 1, wherein the step of providing two light scattering plates, further comprises providing glass beads having diameters limited to the range of 20 μm to 40 μm inclusive, for the glass bead layer.

6. The method of claim 5, wherein the glass bead layer is provided with a thickness of approximately 1 mm.

7. The method of claim 1, wherein the step of providing two light scattering plates, further comprises providing glass beads having a plurality of diameters, for the glass bead layer.

8. The method of claim 1, wherein the step of providing two light scattering plates, further comprises providing 20% to 50% of the glass beads for the glass bead layer with glass beads having diameters limited to the range of 200 μm to 350 μm inclusive, wherein the 20% to 50% of the glass beads is determined by bead weight.

9. The method of claim 1, wherein the step of providing two light scattering plates, further comprises providing 30% of the glass beads for the glass bead layer with glass beads having diameters limited to the range of 200 μm to 350 μm inclusive, wherein the 30% of the glass beads is determined by bead weight.

10. The method of claim 1, wherein the through-holes are provided with an aspect ratio greater than 2.5.

11. A method of exposing a photoresist film coated on an inner surface of a through-hole, comprising the steps of:
   a) providing a light scattering plate, the light scattering plate comprising two parallel light-transmissive plates and a glass bead layer intermediate the two light transmissive plates
   b) placing a printed wiring board with through-holes adjacent the light scattering plate;
   c) exposing the through-holes to light by projecting light, from a first side of the printed wiring board, onto the light scattering plate, so that a portion of the light is scattered by the glass bead layer to expose the inner surfaces of the through-holes.

12. The method of claim 11, wherein the step of exposing the through-holes to light further comprises projecting additional light from a second side of the printed wiring board, so that the through-holes are exposed to light from from both the first side and from the second side of the printed wiring board.

13. The method of claim 11, wherein the at least one of the light-transmissive plates is embossed.

14. The method of claim 11, wherein the at least one of the light-transmissive plates has fine irregularities on a surface of said one light-transmissive plate.

15. The method of claim 11, wherein the step of providing a light scattering plate, further comprises providing glass beads having diameters limited to the range of 20 $\mu$m to 40 $\mu$m inclusive, for the glass bead layer.

16. The method of claim 15, wherein the glass bead layer is provided with a thickness of approximately 1 mm.

17. The method of claim 11, wherein the step of providing a light scattering plate, further comprises providing glass beads having different diameters, for the glass bead layer.

18. The method of claim 11, wherein the step of providing a light scattering plate, further comprises providing 20% to 50% of the glass beads for the glass bead layer with glass beads having diameters limited to the range of 200 $\mu$m to 350 $\mu$m inclusive, wherein the 20% to 50% of the glass beads is determined by bead weight.

19. The method of claim 11, wherein the step of providing a light scattering plate, further comprises providing 30% of the glass beads for the glass bead layer with glass beads having diameters limited to the range of 200 $\mu$m to 350 $\mu$m inclusive, wherein the 30% of the glass beads is determined by bead weight.

20. The method of claim 11, wherein the through-holes are provided with an aspect ratio greater than 2.5.

* * * * *